US006409642B2

(12) United States Patent
Tominaga et al.

(10) Patent No.: US 6,409,642 B2
(45) Date of Patent: Jun. 25, 2002

(54) ASSEMBLING DEVICE

(75) Inventors: Morio Tominaga; Katsuya Arai, both of Kanagawa; Shoichi Hayashi, Chiba; Kenichi Kato, Saitama; Tsuyoshi Inoue, Kanagawa; Hiroyuki Suzuki; Tetsuo Higewake, both of Tokyo; Hideaki Tomikawa, Saitama; Takeshi Tokita, Chiba; Norifumi Otsuka, Kanagawa; Hiroshi Teranishi, Tokyo, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/313,383

(22) Filed: May 18, 1999

(30) Foreign Application Priority Data

May 25, 1998 (JP) .......................... P10-143211

(51) Int. Cl.$^7$ ........................... B23Q 3/157; B23C 1/00; B23C 1/12
(52) U.S. Cl. .................... 483/16; 409/202; 409/212; 409/235; 29/740; 29/741; 29/729; 29/795; 228/6.2; 483/15
(58) Field of Search ................... 409/212, 202, 409/234, 235; 483/14, 15, 54, 55, 56, 57, 16; 29/740, 741, 729, 795; 228/6.2

(56) References Cited

U.S. PATENT DOCUMENTS

| 3,964,664 A | * | 6/1976 | Butler et al. ............... 228/6.2 |
| 4,012,818 A | * | 3/1977 | Dornbluth et al. ............ 483/55 |
| 4,116,376 A | * | 9/1978 | Delorme et al. ............. 228/6.2 |
| 4,514,892 A | * | 5/1985 | Tsujimura et al. ............ 483/56 |
| 4,787,141 A | * | 11/1988 | Miyazaki et al. ............. 29/795 |
| 4,934,578 A | * | 6/1990 | Fritsch ....................... 228/6.2 |
| 4,987,668 A | * | 1/1991 | Roesch ....................... 409/212 |
| 5,062,195 A | * | 11/1991 | Binder ........................ 483/15 |
| 5,081,889 A | * | 1/1992 | Takano et al. ................ 82/122 |
| 5,084,959 A | * | 2/1992 | Ando et al. ................... 29/740 |
| 5,086,559 A | * | 2/1992 | Akatsuchi .................... 29/740 |
| 5,233,745 A | * | 8/1993 | Morita ........................ 29/740 |
| 5,249,356 A | * | 10/1993 | Okuda et al. ................. 29/740 |
| 5,323,528 A | * | 6/1994 | Baker ......................... 29/740 |
| 5,375,952 A | * | 12/1994 | Line .......................... 409/202 |
| 5,376,062 A | * | 12/1994 | Zeichner ...................... 483/55 |
| 5,379,514 A | * | 1/1995 | Okuda et al. ................. 29/740 |
| 5,401,229 A | * | 3/1995 | Otsuka et al. ................ 483/15 |
| 5,478,271 A | * | 12/1995 | Thibaut ....................... 483/54 |
| 5,547,537 A | * | 8/1996 | Reynolds et al. ............. 29/740 |
| 5,688,084 A | * | 11/1997 | Fritz et al. .................. 409/202 |
| 5,884,831 A | * | 3/1999 | Sato et al. ................... 228/6.2 |
| 5,890,283 A | * | 4/1999 | Sakemi et al. ................ 29/740 |
| 5,896,652 A | * | 4/1999 | Tagata et al. ................. 29/740 |
| D418,528 S | * | 1/2000 | Honjo et al. ............... D15/199 |

FOREIGN PATENT DOCUMENTS

| EP | 0213746 A2 | 3/1987 | |
| JP | 64-2400 | * 1/1989 | ................... 29/740 |
| JP | 1-241889 | * 9/1989 | ................... 29/740 |
| JP | 1-296700 | * 11/1989 | ................... 29/740 |
| WO | WO 91 11093 | 7/1991 | |

* cited by examiner

Primary Examiner—A. L. Wellington
Assistant Examiner—Erica E Cadugan
(74) Attorney, Agent, or Firm—Rader, Fishman & Grauer PLLC; Ronald P. Kananen (57) ABSTRACT

An assembling device for supplying and assembling a part on an object has a table and a first moving portion disposed above the table, where the first moving portion includes a guide and a movable body. The guide extends in a first direction parallel to a surface of the table out of a range in which the table is positioned. The movable body is movable to a position out of the range in which the table is positioned. The assembling device also has a second moving portion disposed on the table and movable in a second direction transverse to the first direction, the object being mounted on the second moving portion.

24 Claims, 13 Drawing Sheets

FIG. 17
PRIOR ART though the present invention relates to an assembling device for supplying and assembling a part on an object.

ASSEMBLING DEVICE

BACKGROUND OF THE INVENTION

The present invention relates to an assembling device for supplying and assembling a part on an object.

Figure 16:
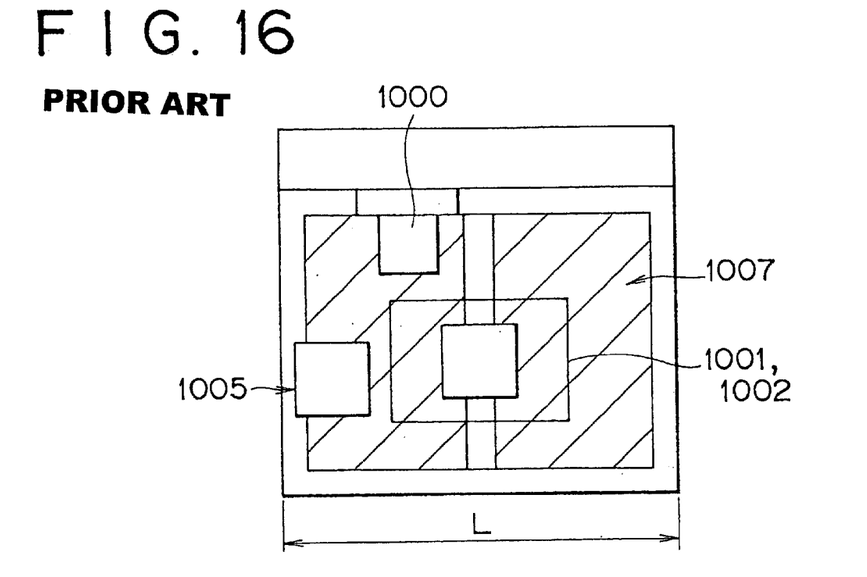
FIG. 16 is a plan view of a related art assembling device.
Figure 17:
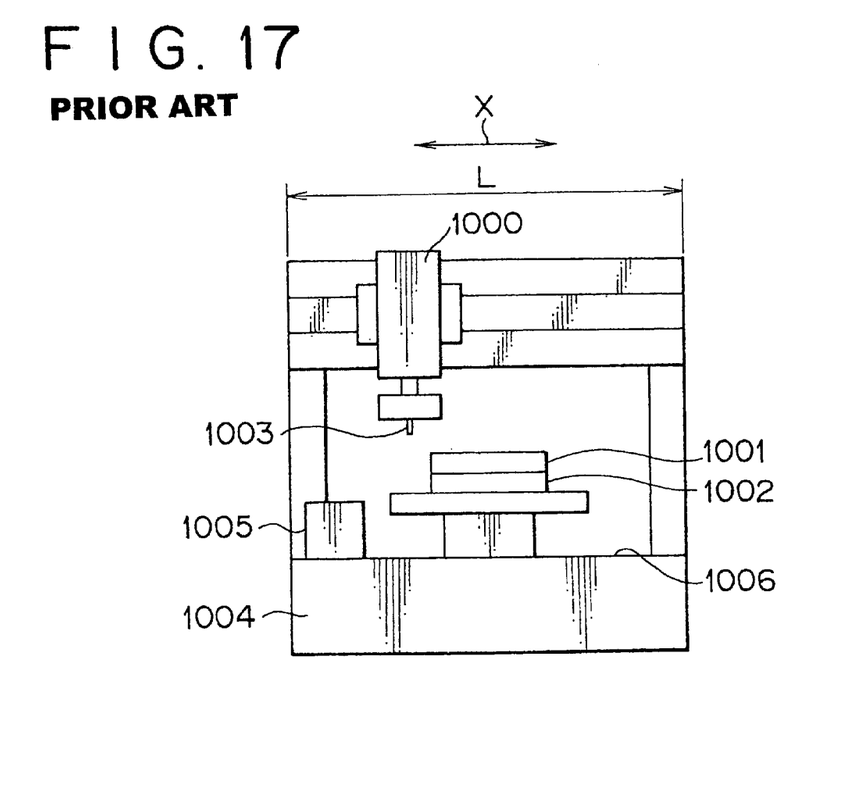
FIG. 17 is a front view of the related art assembling device shown in FIG. 16.

There have been proposed various assembling devices for assembling a part on an object. For example, an assembling device for attaching a circuit board to a chassis with screws has been proposed as shown in FIGS. 16 and 17 of the accompanying drawings.

The proposed assembling device has a head 1000 movable in an X-axis direction for supplying a screw 1003 to a circuit board 1001 and a chassis 1002.

The screw 1003 is supplied to the head 1000 from a screw supply unit 1005 mounted on a table 1004. The screw supply unit 1005 is placed on an upper surface 1006 of the table 1004, and occupies a portion of the table 1004.

The screw supply unit 1005 is placed on the upper surface 1006 of the table 1004 because the head 1000 can be moved only in a movement range L along the X-axis direction. Therefore, the screw supply unit 1005 has to be positioned within the movement range L.

Accordingly, an area 1007 shown as hatched in FIG. 16, that can be practically used for work on the upper surface 1006 of the table 1004 is limited because of the presence of the screw supply unit 1005. In order to be able to place a larger circuit board 1001 or chassis 1002 on the table 1004, the area 1007 on the table 1004 has to be increased, and the movement range L of the head 1000 in the X-axis direction has to be increased. Stated otherwise, the assembling device has to be increased in overall size.

Since the screw supply unit 1005 is placed on the upper surface 1006 of the table 1004, there are limitations on the sizes of the circuit board 1001 and the chassis 1002 which are workpieces that can be placed on the table 1004. Another disadvantage is that after the circuit board 1001 and the chassis 1002 are fastened together by screws, the screw supply unit 1005 presents an obstacle to replacing them with a new circuit board 1001 and chassis 1002.

SUMMARY OF THE INVENTION

It is an object of the present invention to provide an assembling device which solves the above problems, can be reduced in size, and allows an object or a workpiece to be replaced efficiently.

According to the present invention, there is provided an assembling device for supplying and assembling a part on an object, comprising a table and a first moving means disposed above the table, the first moving means including a guide and a movable body, the guide extending in a first direction parallel to a surface of the table out of a range in which the table is positioned, the movable body being movable to a position out of the range in which the table is positioned.

The first moving means further comprising the guide extending in the first direction, the movable body movable along the guide, and a holder for holding a head detachably on the movable body, the guide has a protruding guide projecting along the first direction from the range in which the table is positioned.

The assembling device further comprises second moving means disposed on the table and movable in a second direction transverse to the first direction, the object being mounted on the second moving means.

The assembling device further comprises parts supply means disposed in a position below the protruding guide.

The holder is capable of replacing a parts assembling head with another head for processing an object.

The guide of the first moving means is supported on columns vertically extending from opposite ends of the table.

The holder has an actuator for moving the head on the guide in a third direction transverse to the first direction and also transverse to the second direction.

The above and other objects, features, and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Preferred embodiments of the present invention will be described in detail below with reference to the accompanying drawings.

The embodiments which will be described below are preferred specific embodiments, and hence have various technically preferable limitations. However, the scope of the invention is not limited to the preferred embodiments unless specifically indicated otherwise.

Figure 1:
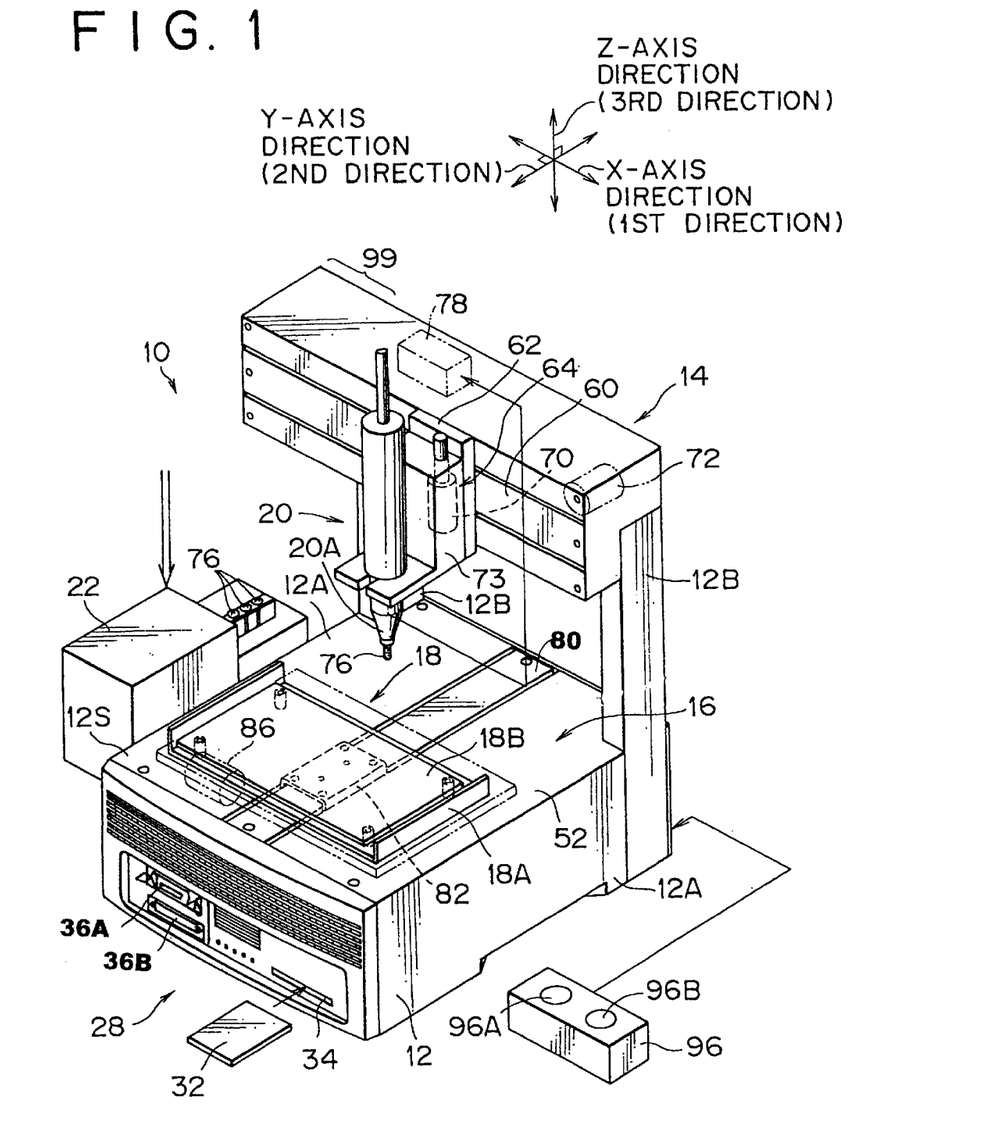
FIG. 1 is a perspective view of an assembling device according to a preferred embodiment of the present invention.

FIG. 1 shows the preferred embodiment of an assembling device 10 according to the present invention. The assembling device 10 generally has a table 12, a first moving means 14, and a second moving means 16.

In the assembling device 10, various movements can be performed in an X-axis direction (first direction), a Y-axis direction (second direction), and a Z-axis direction (third direction), as shown in FIG. 1.

Figure 2:
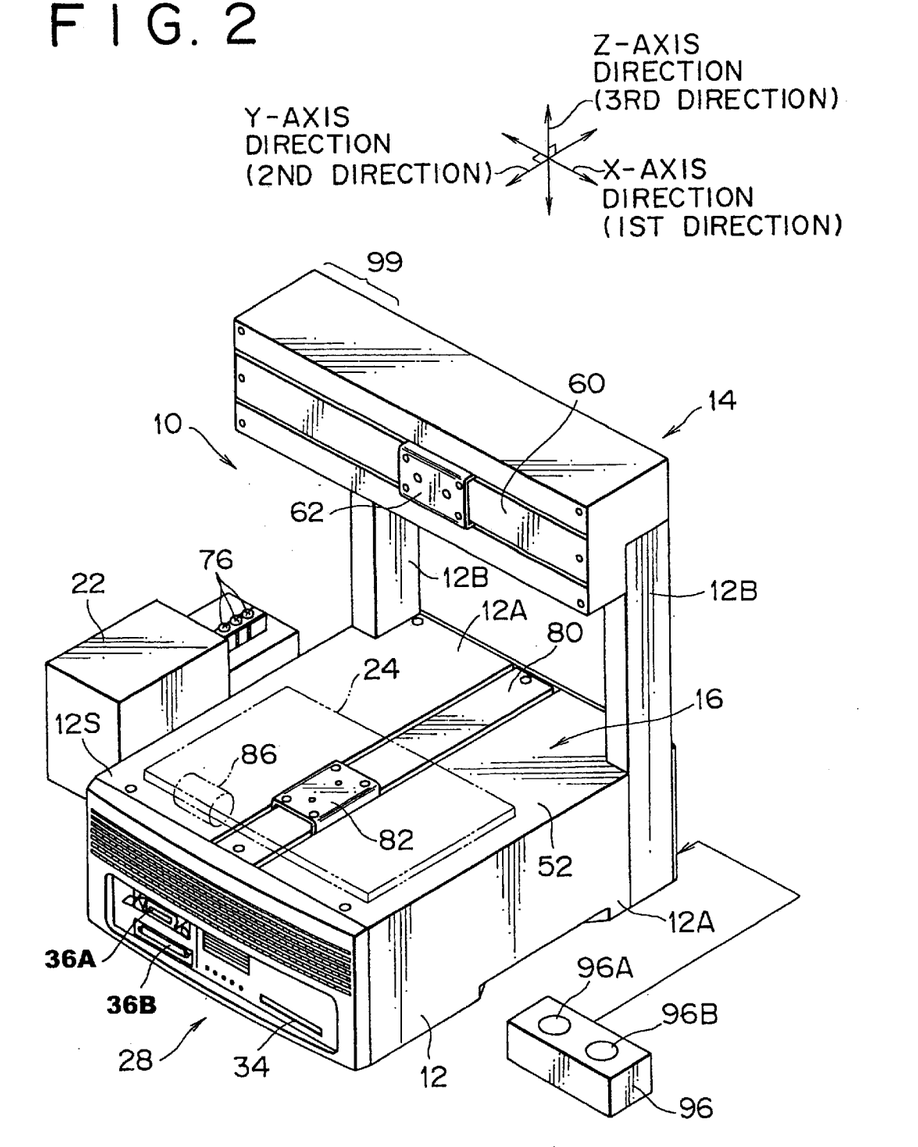
FIG. 2 is a view showing the assembling device illustrated in FIG. 1 with an object and a head removed therefrom.
Figure 3:
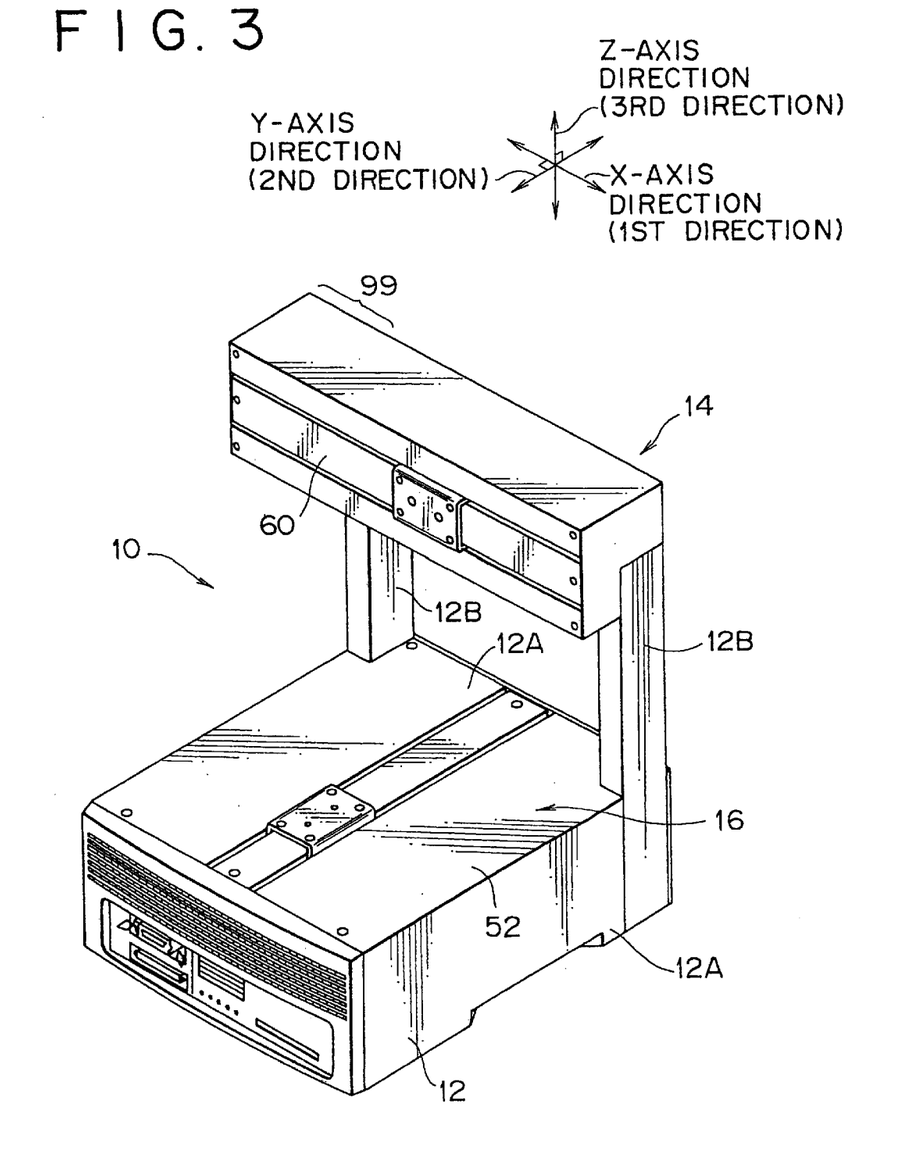
FIG. 3 is a view showing the assembling device illustrated in FIG. 2 with a parts supply unit, etc. further omitted from illustration.
Figure 4:
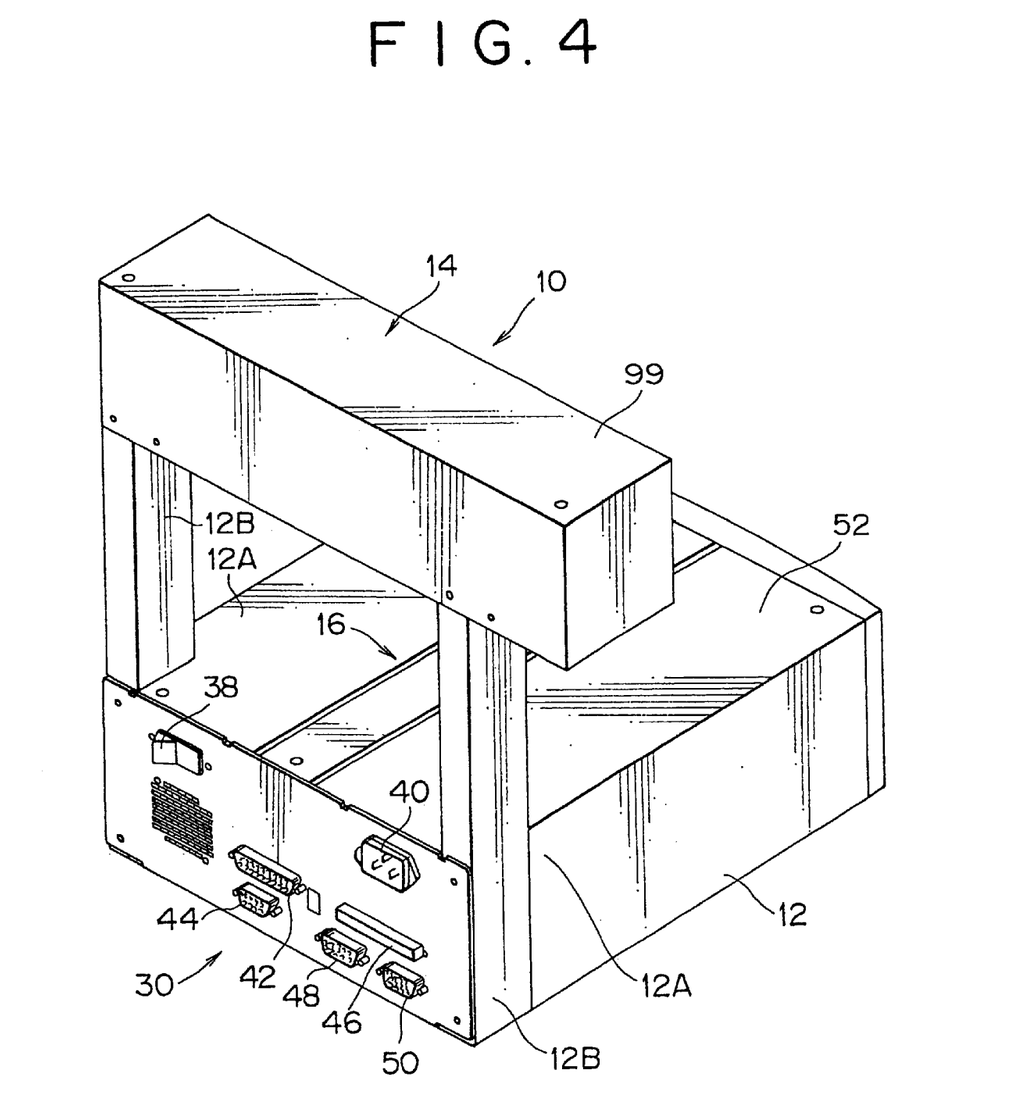
FIG. 4 is a perspective view of the assembling device of FIG. 3 as viewed from its back.

FIG. 1 shows the assembling device 10 in its entirety. FIG. 2 shows the assembling device 10 with an object 18 and a head 20 removed therefrom. FIG. 3 shows the assembling device 10 with a parts supply unit 22 and a support plate 24 of the second moving means 16 omitted from the illustration of FIG. 2. FIG. 4 shows the assembling device 10 of FIG. 3 as viewed from its back.

Figure 5:
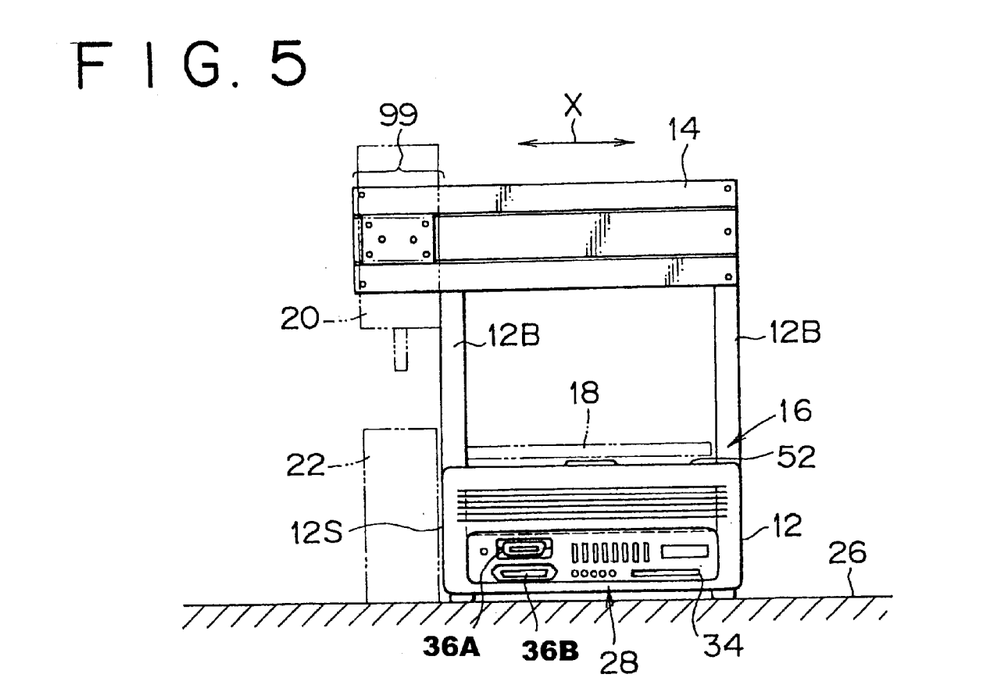
FIG. 5 is a front elevational view of the assembling device illustrated in FIG. 1.
Figure 6:
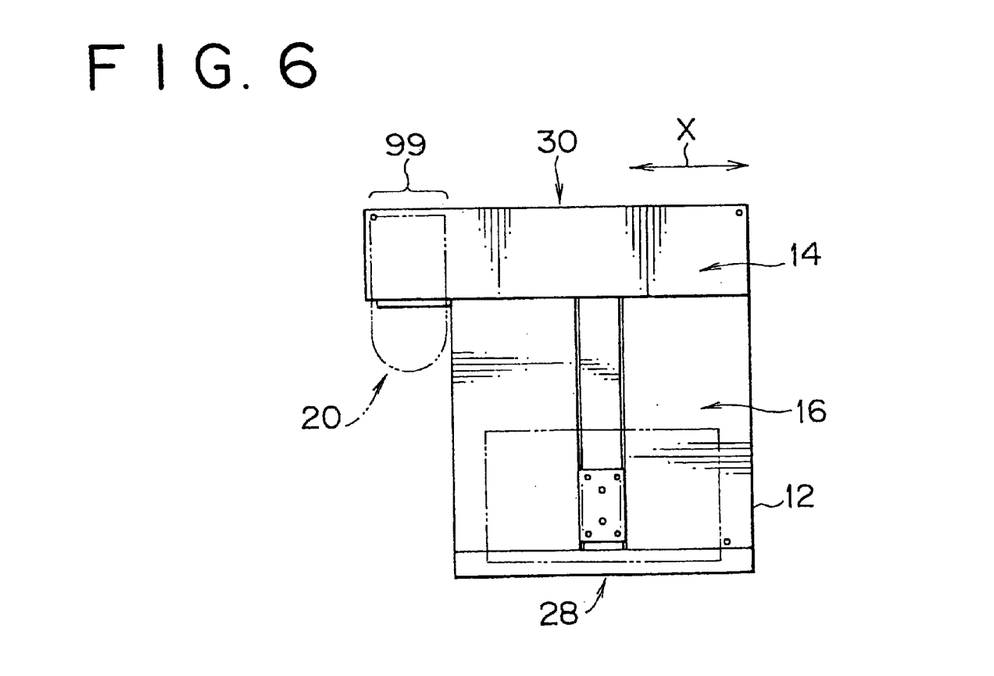
FIG. 6 is a plan view of the assembling device illustrated in FIG. 1.
Figure 7:
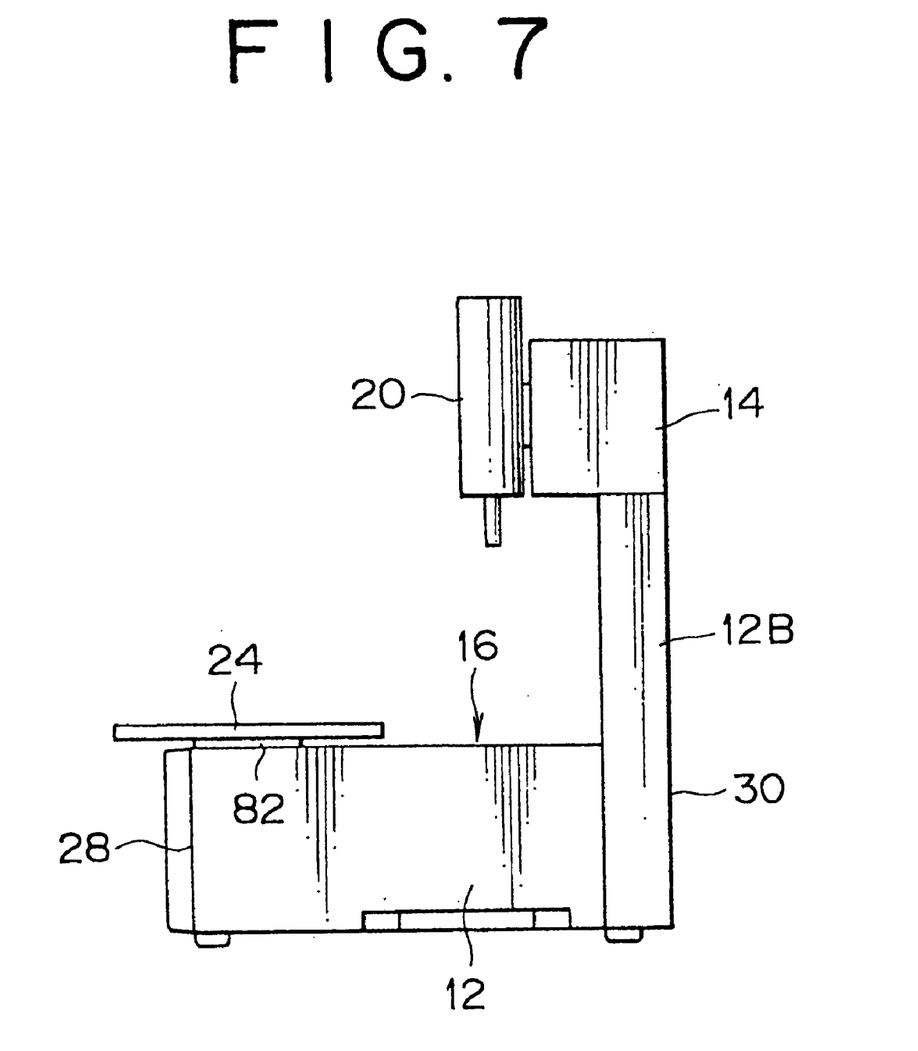
FIG. 7 is a side elevational view of the assembling device illustrated in FIG. 1.

The table 12 is of a small size which can be placed on a base 26 such as a desk, for example, as shown in FIG. 5. As shown in FIGS. 6 and 7, the table 12 has a front panel 28 and a rear panel 30. The front panel 28 shown in FIGS. 1 and 5 has a slot 34 for inserting an IC card (a functional card with an integrated circuit) and various connectors 36A, 36B, etc.

The rear panel 30 shown in FIG. 4 has a main switch 38, a power supply receptacle 40, various connectors 42, 44, 46, 48, 50, etc.

As shown in FIGS. 1 to 4, the table 12 has a plane upper surface 52. In the illustrated embodiment, the table 12 is an elongate rectangular or square shape as viewed from the Z-axis direction (vertical direction). The first moving means 14 has vertical columns 12B, 12B attached to rear ends 12A, 12A of the table 12. The first moving means 14 is mounted along the X-axis direction (first direction) which is preferably parallel to the upper surface 52 of the table 12. The X-axis direction is the same as a lateral direction of the upper surface 52.

In FIGS. 1 to 3, the first moving means 14 has a guide 60 supported in a position remote from the table 12, i.e., suspended by the columns 12B, 12B. The first moving means 14 can move and position the head 20 in the X-axis direction. The first moving means 14 has the guide 60 along the X-axis direction, a movable body 62 (see FIG. 2) movable along the guide 60, and a holder 64 for holding the head 20 detachably on the movable body 62. The guide 60 has a protruding guide 99 which serves to move and position the head 20 in a parts supply position SP. Specifically, as shown in FIGS. 1, 5, and 6, the protruding guide 99 projects to a position out of the range of the upper surface 52 of the table 12, to one side of the table 12 in the X-axis direction.

Figure 10:
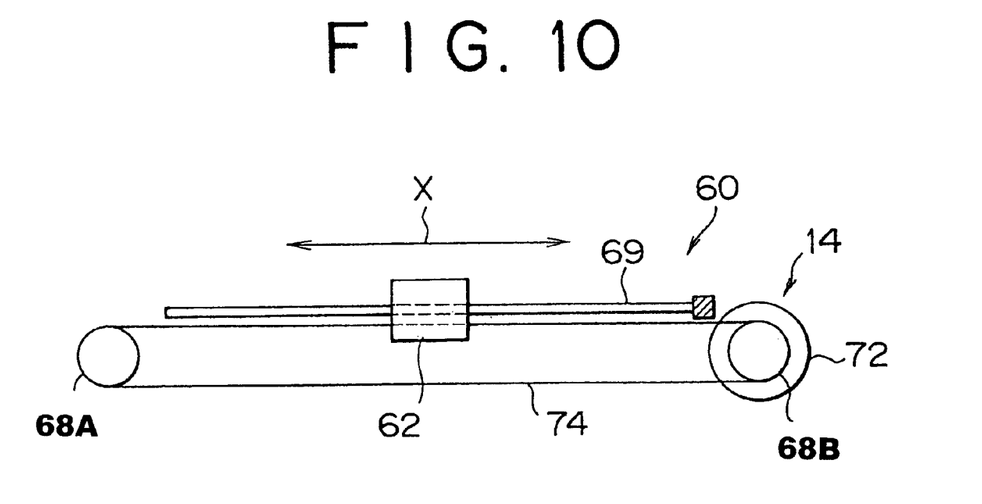
FIG. 10 is a view showing the manner in which a first moving means shown in FIG. 1 is driven.

The guide 60 may be of a construction as shown in FIG. 10, for example. In FIG. 10, the guide 60 has pulleys 68A, 68B, a motor 72, and a toothed belt (also referred to as a timing belt) 74 which is trained around the pulleys 68A, 68B. The movable body 62 of FIG. 2 is attached to the toothed belt 74 and guided by a guide bar 69. The motor 72 may comprise a pulse motor, for example. When the motor 72 is energized, the movable body 62 is moved by the toothed belt 74 trained around the pulleys 68A, 68B and can be positioned in the X-axis direction.

The holder 64 is detachably mounted on the movable body 62 by screws or the like. In FIG. 1, the head 20 is detachably supported on the holder 64. The holder 64 has a driving cylinder 70 for lowering or lifting the head 20 in multiple steps in the Z-axis direction (third direction) When the driving cylinder 70 is operated, a slider 73 of the holder 64 is vertically moved in the Z-axis direction. The head 20 is detachably held on the slider 73.

The head 20 is a device capable of attracting and holding a screw 76 releasably, and threading the screw 76 into the object 18. The head 20 is connected to a suction unit 78. When the suction unit 78 is actuated, the head of the screw 76 is attracted under vacuum to a tip end 20A of the head 20. The head 20 rotates the vacuum attracted screw 76 with a motor or pneumatic pressure to thread the screw 76 into a screw hole of the object 18.

The head 20 can be moved and positioned above the parts supply unit 22 by the first moving means 14. As shown in FIG. 1, the parts supply unit 22 holds a succession of screws 76.

Figure 8:
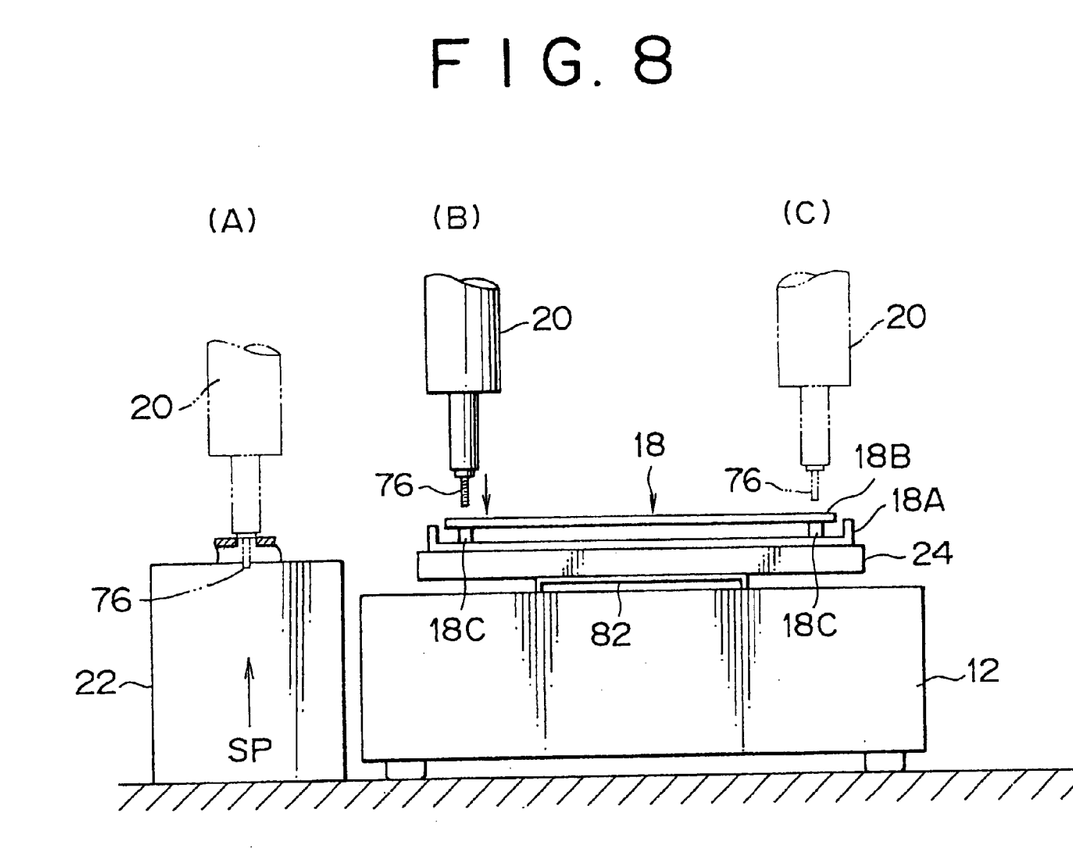
FIG. 8 is a view showing the manner in which screws are supplied to and threaded into an object by the assembling device illustrated in FIG. 1.

When the head 20 is positioned above a screw 76 on the parts supply unit 22, i.e., in the parts supply position SP as shown at a position (A) in FIG. 8, the suction unit 78 shown in FIG. 1 is operated to attract and hold a screw 76 under vacuum.

When the head 20 is moved to a position (B) shown in FIG. 8 or a position (C) shown in FIG. 8, the head 20 can position and thread the screw 76 into the object 18.

Figure 11:
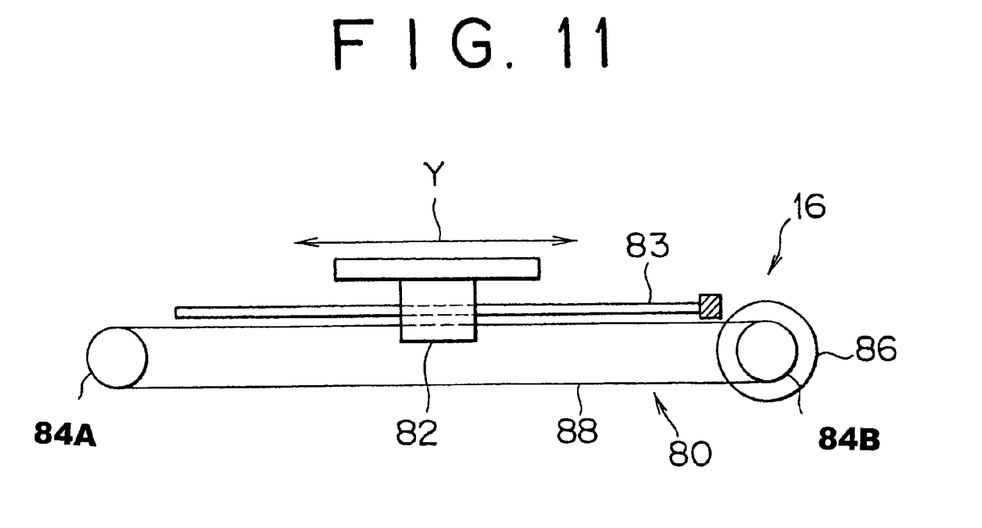
FIG. 11 is a view showing the manner in which a second moving means shown in FIG. 1 is driven.

The second moving means 16 is incorporated in the table 12, and has a guide 80 and a slider 82 as shown in FIGS. 2 and 11. The guide 80 has pulleys 84A, 84B, a motor 86, and a toothed belt 88 with a slider 82 mounted thereon. The slider 82 is guided by a guide bar 83. When the motor 86 is energized, the slider 82 is moved by the toothed belt 88 and can be positioned in the Y-axis direction.

The X-axis direction, the Y-axis direction, and the Z-axis direction are perpendicular to each other.

As shown in FIGS. 1 and 8, the support plate 24 is detachably mounted on the slider 82. As shown in FIG. 1, the object 18 is detachably attached on the support plate 24 under suction, for example. The object 18 may comprise a chassis 18A and a circuit board 18B, for example. The circuit board 18B can be fixed securely to bosses 18C of the chassis 18A by threading screws 76 into the bosses 18C.

The assembling device 10 can thus assemble the circuit board 18B on the chassis 18A with the screws 76.

Figure 9:
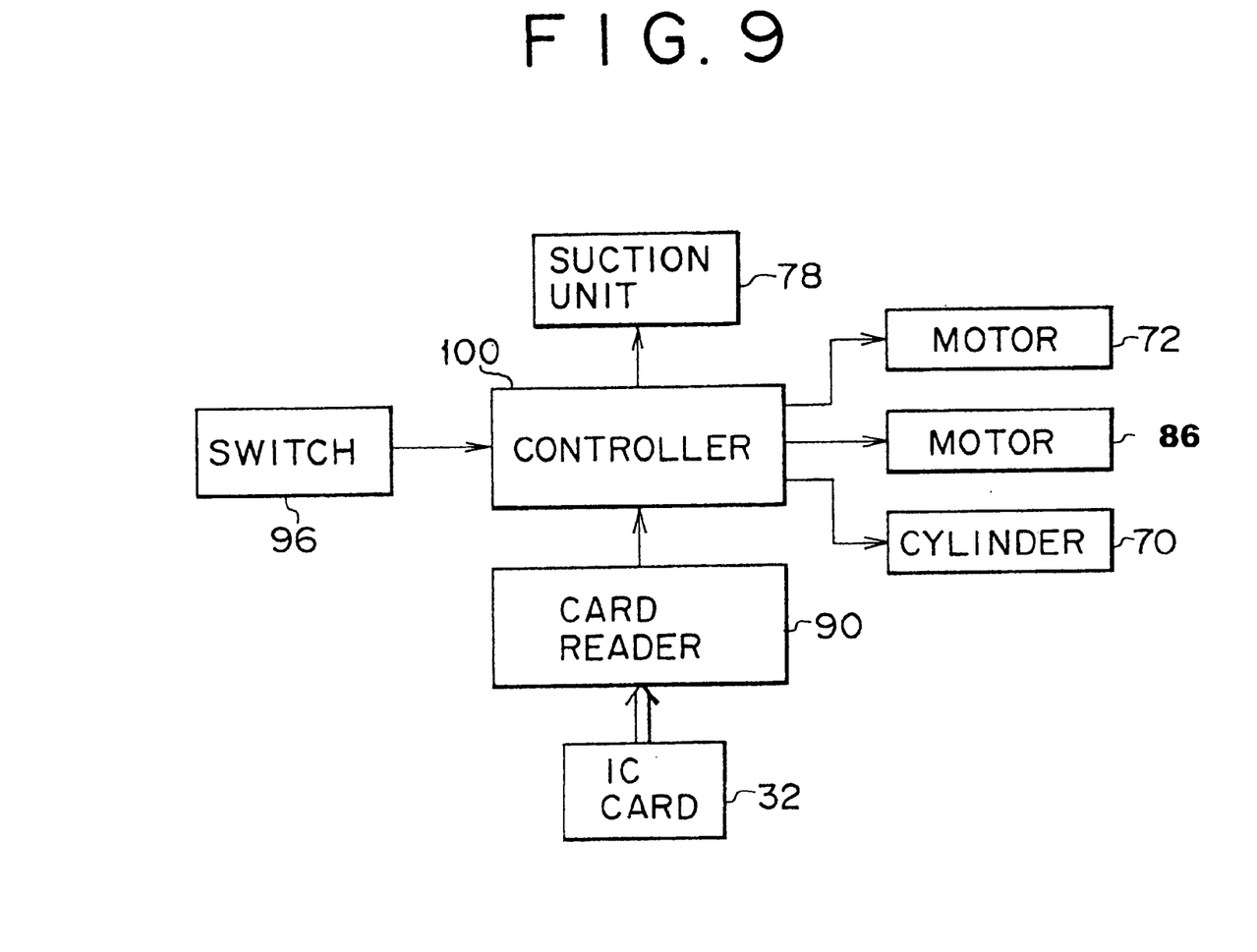
FIG. 9 is a block diagram of a controller of the assembling device illustrated in FIG. 1.

FIG. 9 shows a controller 100 for instructing the motors 72, 86 and the driving cylinder 70 to operate. A card reader 90 is connected to the controller 100. When an IC card 32 is inserted into the card reader 90, the card reader 90 reads the software of an assembling process of parts on the object 18 with screws from the IC card 32, and transmits the read software to the controller 100.

A switch 96 is connected to the controller 100 and has an ON button 96A and an OFF button 96B for turning on and off, respectively, the assembling device 10 shown in FIG. 1.

An example of operation of the assembling device 10 for assembling and fixing the chassis 18A and the circuit board 18B to each other with screws will be described below.

The chassis 18A and the circuit board 18B, i.e., the object 18, are placed in a superposed relation on the support plate 24 shown at position (B) and (C) in FIG. 8. The object 18 may be supplied automatically by an external automatic supply device (including a robot or the like) or manually by the worker.

The parts supply unit 22 shown in FIG. 1 is disposed in the parts supply position SP alongside of the table 12. The parts supply position SP is formed so as to correspond to the protruding guide 99 of the guide 60 of the first moving means.

The protruding guide 99 projects in the X-axis direction from the table 12 near a left-hand side 12S thereof. The projecting state of the protruding guide 99 is clearly shown in FIGS. 5 and 6.

The head 20 is mounted in advance on the slider 73 of the holder 64 shown in FIG. 1.

The controller 100 shown in FIG. 9 gives a command to the motor 86 to move the object 18 in the Y-axis direction on the upper surface 52 of the table 12 and position the object 18 in a predetermined position. The controller 100 also instructs the motor 72 to position the head 20 over a screw 76 in the parts supply position SP. The controller 100 actuates the cylinder 70 to lower the head 20 for attracting the screw 76 under vacuum, as shown at the position (A) in FIG. 8. The controller 100 actuates the cylinder 70 again to lift the head 20.

The head 20 with the screw 76 attracted thereto moves in the X-axis direction (to the right in FIG. 8) as shown at position (B) or (C) in FIG. 8, and is positioned above a hole of the circuit board 18B.

When the cylinder 70 is actuated again, the head 20 threads the screw 76 into the hole of the circuit board 18B and also a hole of the boss 18C.

The above process is repeated to securely assemble and fix the circuit board 18B shown in FIG. 1 on the bosses 18C of the chassis 18A with a plurality of screws 76.

As described above, the assembling device 10 of the present invention has the protruding guide 99 as an extension of the guide 60 of the first moving means 14. As shown in FIGS. 1, 5, and 6, the protruding guide 99 projects from the left-hand side 12S of the table 12. The parts supply unit 22 can be placed in a position below the protruding guide 99.

The parts supply unit 22 is independent of the table 12 and does not need to be placed on the upper surface 52 of the table 12. The parts supply unit 22 may be spaced from the table 12 and mounted on the base 26 as shown in FIG. 5.

Therefore, the space on the upper surface 52 of the table 12 can be fully used for placing the object 18 or workpiece thereon, without parts supply unit 22 occupying a portion of the upper surface 52. The upper surface 52 can sufficiently be used to place the object 18 thereon, and hence can place an object 18 having a wide area thereon. Since the parts supply device 22 is not mounted on the upper surface 52, the object 18 can be placed on and removed from the upper surface 52 highly efficiently.

Inasmuch as the parts supply unit 22 may be positioned on the base 26 substantially in alignment with the protruding guide 99, the parts supply unit 22 can be positioned with large freedom. Besides, the parts supply unit 22 does not pose problems, even if it is large in size, and hence a wide choice is available of sizes for the parts supply unit 22.

The head 20 shown in FIG. 1 is detachably mounted on the slider 73 of the holder 64. If the head 20 for supplying and threading screws 76 is replaced with a head having another function, then the assembling device 10 may be used for performing another such function.

For example, a head having another function may be any of heads performing various functions, such as a cutting head for cutting an object 18 of metal, a nozzle head for applying an adhesive to an object, a machining head for dividing a circuit board into predetermined dimensions, or a soldering head for soldering parts on a circuit board.

Figure 12:
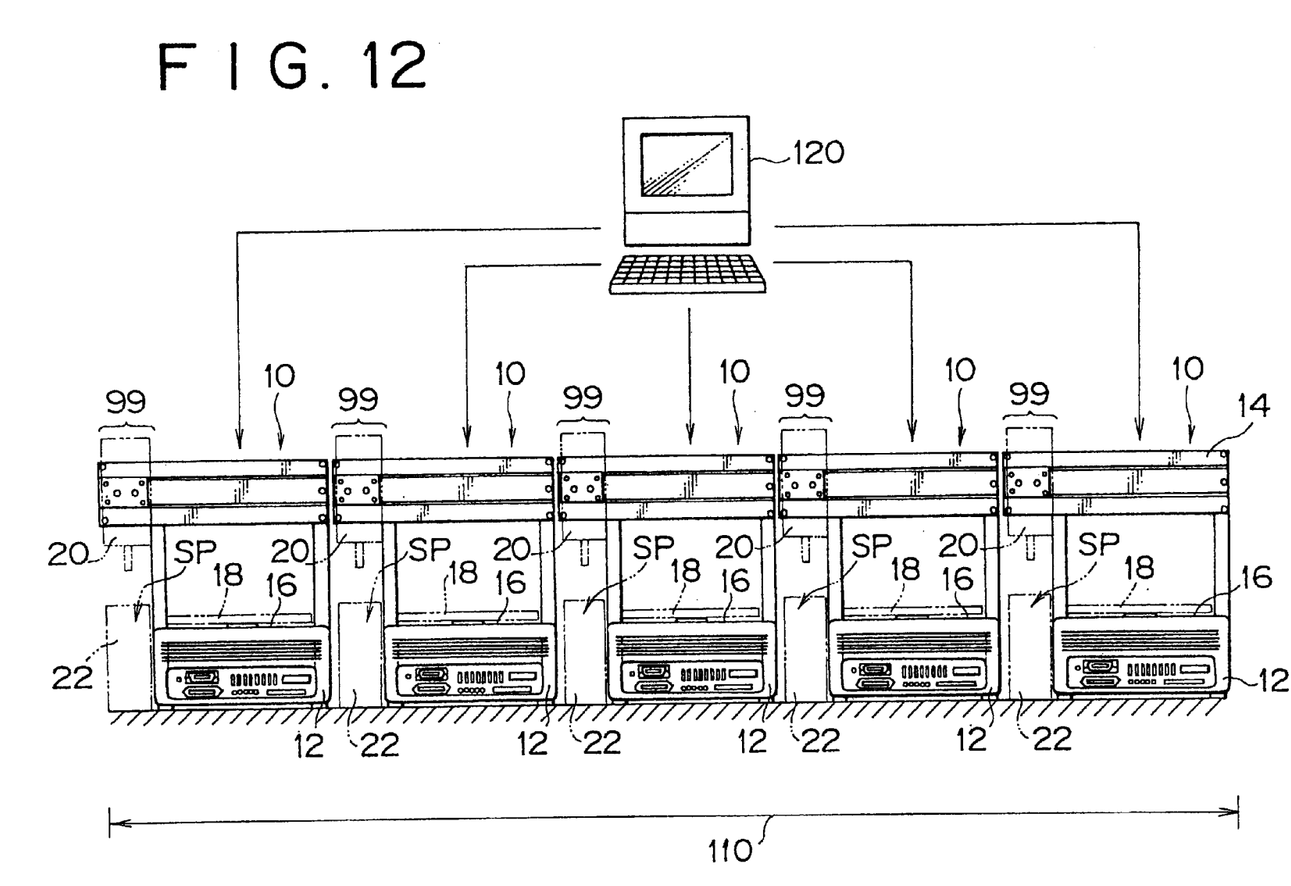
FIG. 12 is a view of an arrangement of plural assembling devices shown in FIG. 1.

FIG. 12 shows an arrangement having a plurality of assembling devices 10 shown in FIG. 1. The parts supply unit 22 is positioned below the protruding guide 99 of the first moving means 14 of each of the assembling devices 10. The parts supply unit 22 may be disposed in a parts supply position SP formed between adjacent tables 12. This arrangement of the plural assembling devices 10 occupies a minimum width 110. The plural assembling devices 10 can be controlled in a coordinated fashion by a computer 120.

Figure 13:
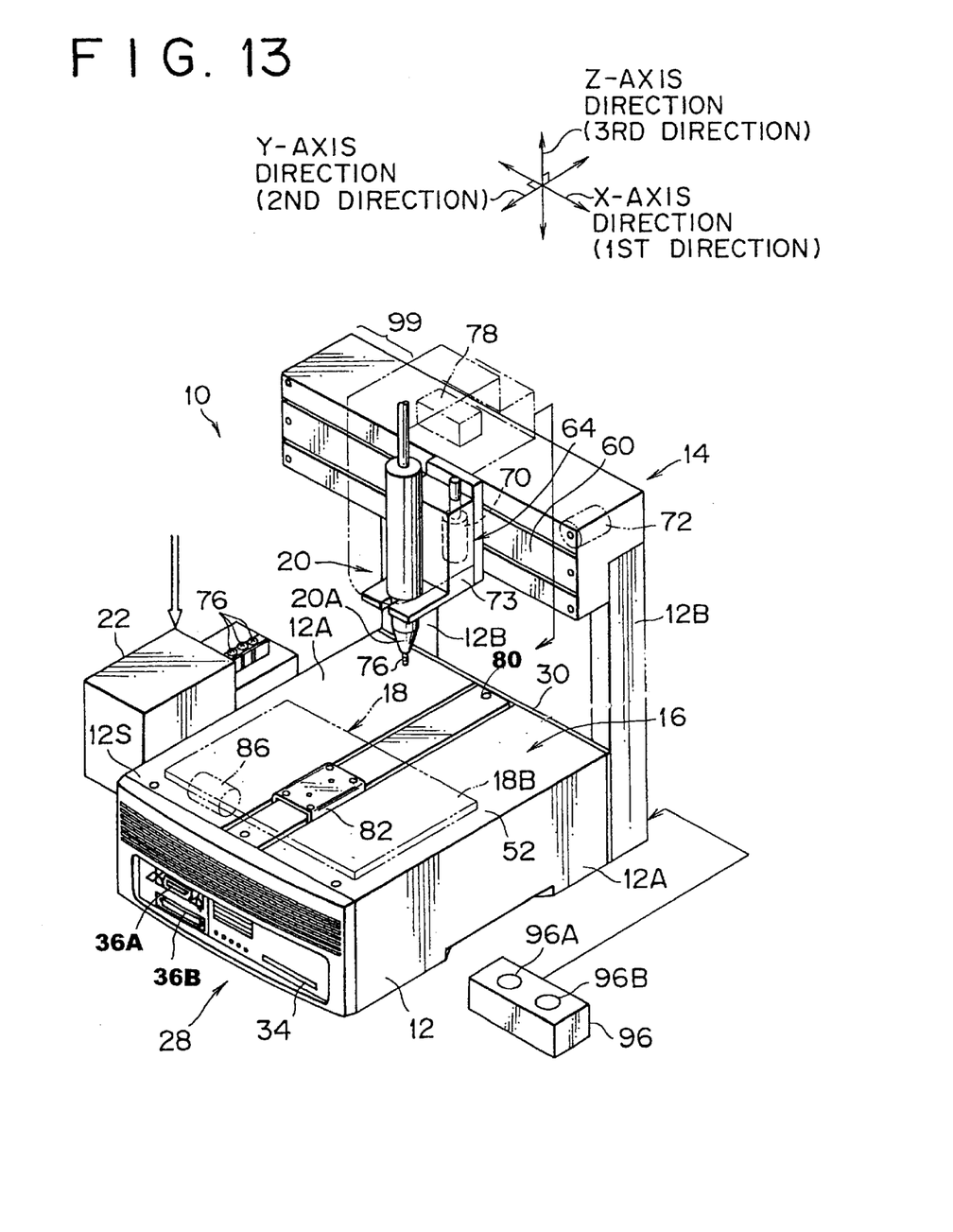
FIG. 13 is a perspective view of an assembling device according to another embodiment of the present invention.

FIG. 13 shows an assembling device 10 according to another embodiment of the present invention. The assembling device 10 shown in FIG. 13 differs from the assembling device 10 shown in FIG. 1 in that the columns 12B, 12B of the first moving means 14 are attached to the rear panel 30 of the table 12. The columns 12B, 12B attached to the rear panel 30 allow the upper surface 52 of the table 12 to provide a wider area that can be used. The columns 12B, 12B are less obstructive to movement of the object 18. Other details of the assembling device 10 shown in FIG. 13 are identical to those of the assembling device 10 shown in FIG. 1. For those details, reference should be made to the description of the structure and operation of the assembling device 10 shown in FIG. 1.

Figure 14:
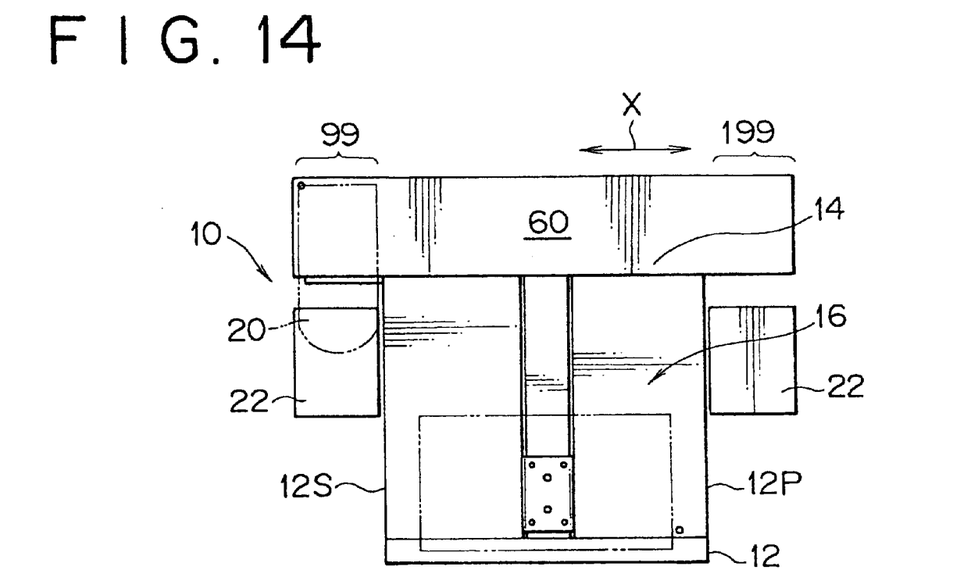
FIG. 14 is a plan view of an assembling device according to still another embodiment of the present invention.
Figure 15:
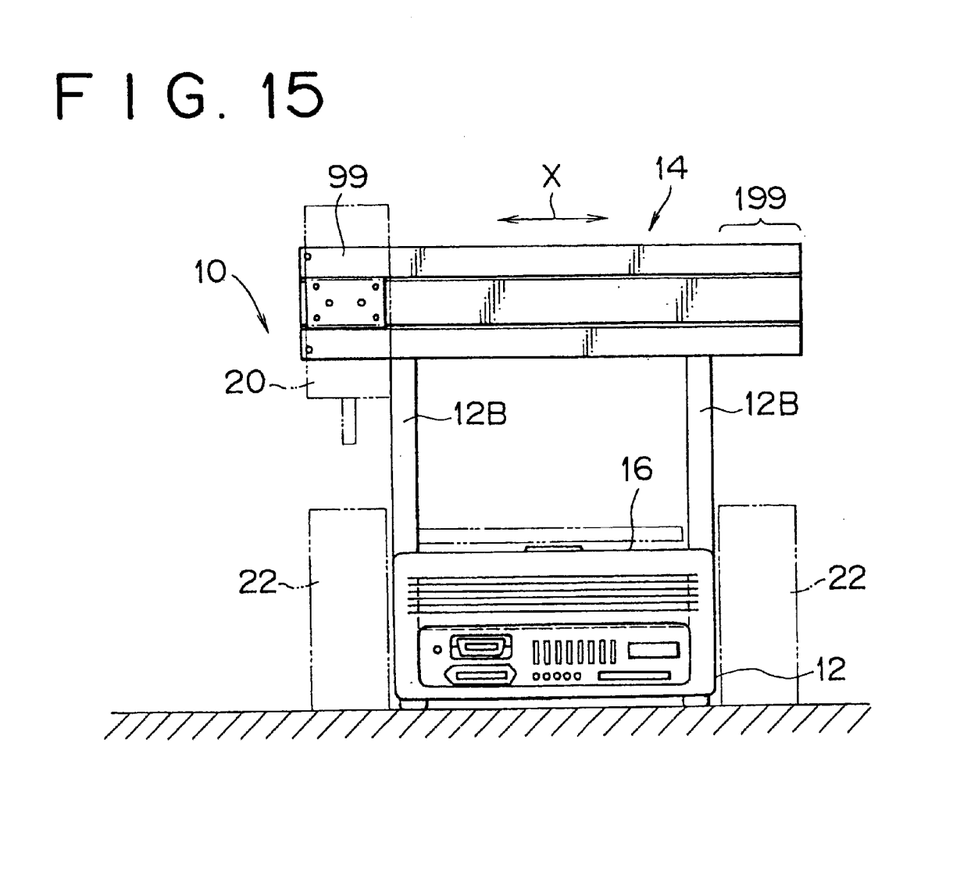
FIG. 15 is a front elevational view of the embodiment shown in FIG. 14.

FIGS. 14 and 15 show an assembling device 10 according to still another embodiment of the present invention. The assembling device 10 shown in FIGS. 14 and 15 is identical to the assembling device 10 shown in FIG. 1 in that it has the table 12 and the second moving means 16. The assembling device 10 shown in FIGS. 14 and 15 has a first moving means 14 including protruding guides 99, 199 disposed respectively in left- and right-hand positions thereof. Specifically, the protruding guide 99 extends into a side facing a left-hand side 12S of the table 12, and the protruding guide 199 extends into an opposite side facing an another side 12P of the table 12.

With the above arrangement, the head 20 can move along the guide 60 of the first moving means 14 in the X-axis direction and further into a wider range coextensive with the protruding guide 99 or the protruding guide 199. If parts supply units 22 are placed below the respective protruding guides 99, 199, then the parts supplying capability of the assembling device can be increased.

The present invention is not limited to the above embodiments.

In the illustrated embodiments, the object (workpiece) 18 is described as a chassis and a circuit board. However, the object 18 is not limited to those components, but may be components in other fields or areas.

For example, if the head 20 is a soldering head, then the object may be a circuit board, for example. If the head has a function to cut an object, then the object may be a metal piece or a circuit board.

The actuator for vertically moving the head 20 is not limited to a driving cylinder, but may be a combination of a motor and a feed screw.

The first moving means in the X-axis direction and the second moving means in the Y-axis direction may also be a combination of a motor and a feed screw.

According to the present invention, as described above, the assembling device may be small in size and allows an object or workpiece to be replaced highly efficiently.

Although certain preferred embodiments of the present invention have been shown and described in detail, it should be understood that various changes and modifications may be made therein without departing from the scope of the appended claims.

What is claimed is:

1. An assembling device for supplying and assembling a part on an object, comprising:
  a table for supporting said object, a face of said table having a slot for receiving an integrated circuit card, wherein said integrated circuit card contains software for directing said assembling of said part on said object; and a first moving means disposed above and attached to said table, said first moving means including:
   a movable body, and
   a guide extending in a first direction parallel to a surface of the table beyond a width of said table.

2. The assembling device according to claim 1, wherein said first moving means further comprises:
   said movable body being movable along said guide, and a holder for detachably holding a head on said movable body, said guide has a protruding guide projecting therefrom along said first direction beyond the width of said table.

3. The assembling device according to claim 2, wherein said holder has an actuator for moving the head on said guide in a third direction respectively transverse to said first direction and to a second direction which is transverse to said first direction.

4. The assembling device according to claim 2, further comprising a parts supply means disposed in a position below said protruding guide.

5. An assembling device according to claim 2, wherein a parts assembling head is replaceable with another head for processing said object due to being detachably mounted on said holder.

6. The assembling device according to claim 2, wherein said guide of said first moving means is supported on columns vertically extending from opposite ends of said table.

7. The assembling device according to claim 1, further comprising a second moving means disposed on said table and movable in a second direction transverse to said first direction, and said object being mounted on said second moving means.

8. A processing apparatus for processing an object comprising:
   a table for supporting said object, a face of said table having a slot for receiving an integrated circuit card, wherein said integrated circuit card contains software for directing said processing of said object, said processing comprising an assembly process;
   a pair of columns extending vertically and attached to opposite ends of said table;
   a guide means supported on said pair of columns and extending in a first direction parallel to a surface of the table and having an overhang portion;
   a moving means including a moveable body disposed above the table, said moveable body being moveable in said first direction along said guide means,
   wherein said moving means is moveable to a position as determined by said overhang portion beyond an area between said pair of columns where said table is positioned.

9. The processing apparatus of claim 8, further including:
   a means for supplying said object for processing by said moving means,
   said supplying means being placed under the overhang portion of said guide means.

10. The processing apparatus of claim 9, wherein said moveable body is an assembling head and said object is a component.

11. The processing apparatus of claim 10, wherein said head is a suction unit for accomplishing vacuum attraction.

12. The processing apparatus of claim 9, wherein said moveable body is a soldering head and said object is a circuit board.

13. The processing apparatus of claim 9, wherein said moveable body is a cutting head and said object is one of a metal piece and circuit board.

14. The processing apparatus of claim 9, wherein said supplying means is positioned on a base and substantially in alignment with said guide means.

15. The processing apparatus of claim 9, wherein said supplying means is independent from said table and is mounted on a base.

16. The processing apparatus of claims 1 or 8, wherein said table is rectangular or square and can be located on a desk.

17. The processing apparatus of claim 8, wherein said table has front and rear panels, and said front panel includes said slot.

18. The processing apparatus of claim 17, further comprising:
   a controller for commanding a motor and positioning said object, responsive to assembly process software loaded onto said integrated circuit card.

19. The processing apparatus of claim 8, wherein said moveable body is detachably mounted on the moving means.

20. The processing apparatus of claim 19, further comprising a slider disposed on said table and moveable in a second direction tranverse to said first direction, said object being mounted on said slider.

21. The processing apparatus of claim 20, wherein said moveable body has an actuator for moving the moveable body in a third direction transverse to both the first direction and to the second direction.

22. The processing apparatus of claim 8, wherein said guide means includes a pulley, a motor, and a toothed belt.

23. The processing apparatus of claim 8, further comprising a second moving means having a guide, pulleys, a motor, and toothed belt.

24. The processing apparatus of claim 8, wherein said processing apparatus comprises a plurality of said processing apparatuses that are controlled by a computer.

* * * * *